United States Patent
Thomsen et al.

(10) Patent No.: US 9,429,370 B1
(45) Date of Patent: Aug. 30, 2016

(54) HEAT SINK WITH FLAT HEAT PIPE

(71) Applicant: UNIGEN Corporation, Fremont, CA (US)

(72) Inventors: David Thomsen, Reno, NV (US); Simon Tam, Santa Cruz, CA (US)

(73) Assignee: UNIGEN CORPORATION, Fremont, CA (US)

(*) Notice: Subject to any disclaimer, the term of this patent is extended or adjusted under 35 U.S.C. 154(b) by 184 days.

(21) Appl. No.: 14/288,149

(22) Filed: May 27, 2014

(51) Int. Cl.
| | |
|---|---|
| *H05K 7/20* | (2006.01) |
| *F28D 15/02* | (2006.01) |
| *F28D 15/04* | (2006.01) |
| *B23P 19/04* | (2006.01) |
| *H05K 5/04* | (2006.01) |
| *H01L 23/473* | (2006.01) |

(52) U.S. Cl.
CPC .......... *F28D 15/0275* (2013.01); *B23P 19/04* (2013.01); *F28D 15/046* (2013.01); *H05K 5/04* (2013.01); *H05K 7/20336* (2013.01); *H05K 7/20418* (2013.01)

(58) Field of Classification Search
CPC .............................. G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | | |
|---|---|---|---|---|
| 7,903,419 B2 * | 3/2011 | Li | ............ | H01L 23/40 165/185 |
| 2006/0146499 A1 * | 7/2006 | Reents | ............... | H01L 23/4093 361/704 |
| 2006/0181848 A1 * | 8/2006 | Kiley | .................... | H01L 23/427 361/697 |
| 2008/0007915 A1 * | 1/2008 | Chen | ................... | H01L 23/4006 361/701 |
| 2008/0030956 A1 * | 2/2008 | Silverstein | ......... | F28D 15/0266 361/700 |
| 2008/0121372 A1 * | 5/2008 | Zhou | .................... | H01L 23/4006 165/80.3 |
| 2008/0135215 A1 * | 6/2008 | Wu | ....................... | H01L 23/427 165/104.33 |
| 2008/0174952 A1 * | 7/2008 | Ye | ....................... | H01L 23/4006 361/679.48 |
| 2008/0191341 A1 * | 8/2008 | Nishiyama | ............. | G06F 1/203 257/719 |
| 2008/0216990 A1 * | 9/2008 | Min | ..................... | F28D 15/0233 165/80.3 |
| 2008/0285236 A1 * | 11/2008 | Phillips | ................ | G02B 6/4246 361/709 |
| 2009/0135562 A1 * | 5/2009 | Yang | ..................... | H01L 23/467 361/697 |
| 2009/0154105 A1 * | 6/2009 | Chu | .................... | H01L 23/4093 361/703 |
| 2009/0161314 A1 * | 6/2009 | Liu | ..................... | H01L 23/4093 361/697 |
| 2009/0266512 A1 * | 10/2009 | Lu | ...................... | H01L 23/3672 165/80.3 |

(Continued)

*Primary Examiner* — Anthony Haughton
*Assistant Examiner* — Razmeen Gafur

(57) ABSTRACT

A heat sink apparatus is disclosed. The apparatus comprises a base unit for use with an electronic component operable to make contact with a heat generating source, wherein the heat generating source is affixed to a printed circuit board. It also comprises a top unit wherein the top unit of the heat sink is rotatively coupled to the base unit, and wherein a slot forms in between the top unit and the base unit when the top unit is coupled to the base unit. Finally it comprises a heat pipe, wherein the heat pipe is received through the slot and held tightly therein, and wherein the heat pipe is operable to dissipate heat transferred through the base unit away from the heat generating source.

20 Claims, 6 Drawing Sheets

(56) References Cited

U.S. PATENT DOCUMENTS

| | | | | |
|---|---|---|---|---|
| 2009/0269952 | A1* | 10/2009 | Yu | H01L 23/4093 439/78 |
| 2010/0172103 | A1* | 7/2010 | Du | H01L 23/4093 361/710 |
| 2010/0328887 | A1* | 12/2010 | Refai-Ahmed | H01L 23/427 361/697 |
| 2011/0075366 | A1* | 3/2011 | Tomioka | H05K 7/20336 361/697 |
| 2011/0090647 | A1* | 4/2011 | Li | H01L 23/427 361/697 |
| 2011/0096502 | A1* | 4/2011 | Li | H01L 23/4006 361/700 |
| 2011/0110031 | A1* | 5/2011 | Homer | G06F 1/20 361/679.54 |
| 2011/0110040 | A1* | 5/2011 | Liu | H01L 23/4006 361/696 |
| 2011/0110042 | A1* | 5/2011 | Zhang | H01L 23/427 361/700 |
| 2011/0267777 | A1* | 11/2011 | Oike | G06F 1/203 361/697 |
| 2011/0279969 | A1* | 11/2011 | Memon | G06F 1/20 361/679.47 |
| 2011/0310559 | A1* | 12/2011 | Horng | F21V 29/2212 361/697 |
| 2012/0268890 | A1* | 10/2012 | Stock | G06F 1/20 361/679.53 |
| 2013/0155624 | A1* | 6/2013 | Yang | H01L 23/4093 361/720 |
| 2013/0327507 | A1* | 12/2013 | Degner | G06F 1/203 165/120 |

* cited by examiner

HEAT SINK WITH FLAT HEAT PIPE

FIELD OF THE INVENTION

This invention relates generally to a heat dissipation device and particularly to a heat dissipation device having a heat pipe.

BACKGROUND OF THE INVENTION

Heat dissipation devices are commonly used for cooling electronic components such as processors, e.g., central processing units (CPUs). As electronic components such as CPU chips become more integrated and miniaturized and the thermal density of the components increases, effective cooling methods are required to dissipate the heat that builds up. Conventional heat dissipation devices may comprise a heat pipe and a heat sink, wherein the heat pipe is typically tubular with a circular cross section. The heat sink is typically a heat conducting plate (base) and is attached to a heat source so that the heat will be quickly dissipated through the heat pipe connected to the heat sink.

Conventional methods of fitting a circular heat pipe to the heat sink can be problematic. Welding the heat pipe to the heat sink is problematic, for instance, because welding is complicated and not friendly to the environment. Further, in cases where the heat pipe is welded to the heat sink, gaps can result between the heat pipe and the heat sink so that fitting is hard to achieve. Accordingly, this method can also be wasteful and uneconomic. In some designs, conducting glue is used between the heat pipe and the heat sink to act as an adhesive. However, the glue can solidify over time and result in gaps so that heat dissipation will be affected.

Further, conventional methods of fitting a heat pipe to a heat sink are rigid and inflexible. Once the heat pipe is fitted into the heat sink, through welding or other fixed means, it is not possible to readily re-orient the heat pipe or detach it from the heat sink. This makes it challenging to service the CPU or other component that the heat dissipation device is being used to cool down.

BRIEF SUMMARY OF THE INVENTION

Accordingly, there is a need for a heat sink assembly comprising a heat pipe that allows the heat pipe to be fitted into the heat sink assembly in a fast and economic way to ensure tight connection and effective heat dissipation. Additionally, there is a need for a heat sink assembly that allows the heat pipe to be readily detached from the heat sink and re-oriented if needed in a way such that the heat pipe can be directed in one of several directions in accordance with the design requirements of the device containing the heat sink assembly. Further, there is a need for an readily detachable heat pipe that allows the processor or other component that is being cooled down using the heat sink assembly to be serviced or replaced readily in the event of part failure.

In one embodiment, a flat heat pipe is employed that is fitted through a slot in a two-piece clamping heat sink unit, wherein the slot is sized in accordance with the dimensions of the heat pipe to ensure that the heat pipe tightly fits to the clamping unit in order to achieve more efficient heat dissipation. Further, in one embodiment, the two-piece clamping unit is designed such that the heat pipe can be re-oriented at different angles in the x-y plane to allow easy configurability of the orientation of the heat pipe.

In one embodiment, a heat sink apparatus is presented. The apparatus comprises a base unit for use with an electronic component operable to make contact with a heat generating source, wherein the heat generating source is affixed to a printed circuit board. It also comprises a top unit wherein the top unit of the heat sink is rotatively coupled to the base unit, and wherein a slot forms in between the top unit and the base unit when the top unit is coupled to the base unit. Finally it comprises a heat pipe, wherein the heat pipe is received through the slot and held tightly therein, and wherein the heat pipe is operable to dissipate heat transferred through the base unit away from the heat generating source.

In one embodiment, a method of assembling a heat dissipating device is presented. The method comprises providing a base unit of a heat sink for coupling to a heat generating source, wherein the heat generating source is affixed to a printed circuit board. It also comprises removably coupling a top unit of the heat sink to the base unit, wherein a slot forms in between the top unit and the base unit in response to the coupling. Additionally, it comprises receiving a heat pipe through the slot, wherein the heat pipe is operable to dissipate heat transferred through the base unit away from the heat generating source and wherein the heat pipe is tightly held in the slot.

In another embodiment, a heat dissipating system is presented. The system comprises a base unit of a heat sink operable to make contact with a heat generating source, wherein the heat generating source is part of an electronic device. It also comprises a top unit of the heat sink, wherein the top unit of the heat sink is operable to be removably coupled to the base unit in a plurality of different orientations, and wherein a slot forms in between the top unit and the base unit when the top unit is coupled to the base unit in any of the plurality of different orientations. Further, it comprises a heat pipe received through the slot, and wherein the heat pipe is operable to dissipate heat transferred through the base and top units away from the heat generating source. Finally, it comprises a metal enclosure, wherein the electronic device, the heat sink and the heat generating source are housed within the metal enclosure, and wherein the heat pipe further is operable to dissipate heat from the heat generating source to the metal enclosure.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

In the figures, elements having the same designation have the same or similar function.

DETAILED DESCRIPTION OF THE INVENTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

For expository purposes, the term "horizontal" as used herein refers to a plane parallel to the plane or surface of an object, regardless of its orientation. The term "vertical" refers to a direction perpendicular to the horizontal as just defined. Terms such as "above," "below," "bottom," "top," "side," "higher," "lower," "upper," "over," and "under" are referred to with respect to the horizontal plane.

Figure 1:
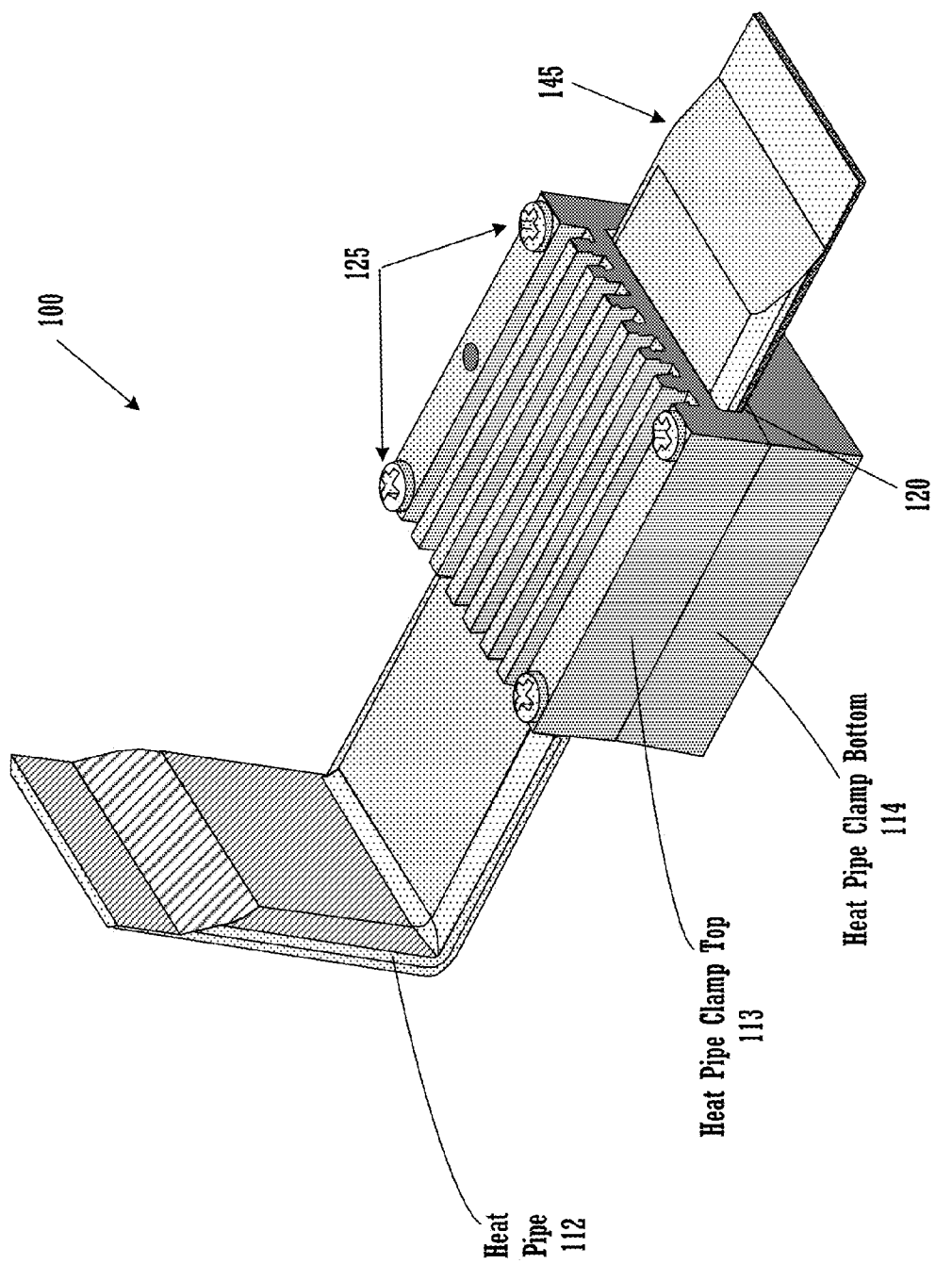
FIG. 1 is an isometric, assembled view of a heat dissipation device in accordance with an embodiment of the present invention.
Figure 2:
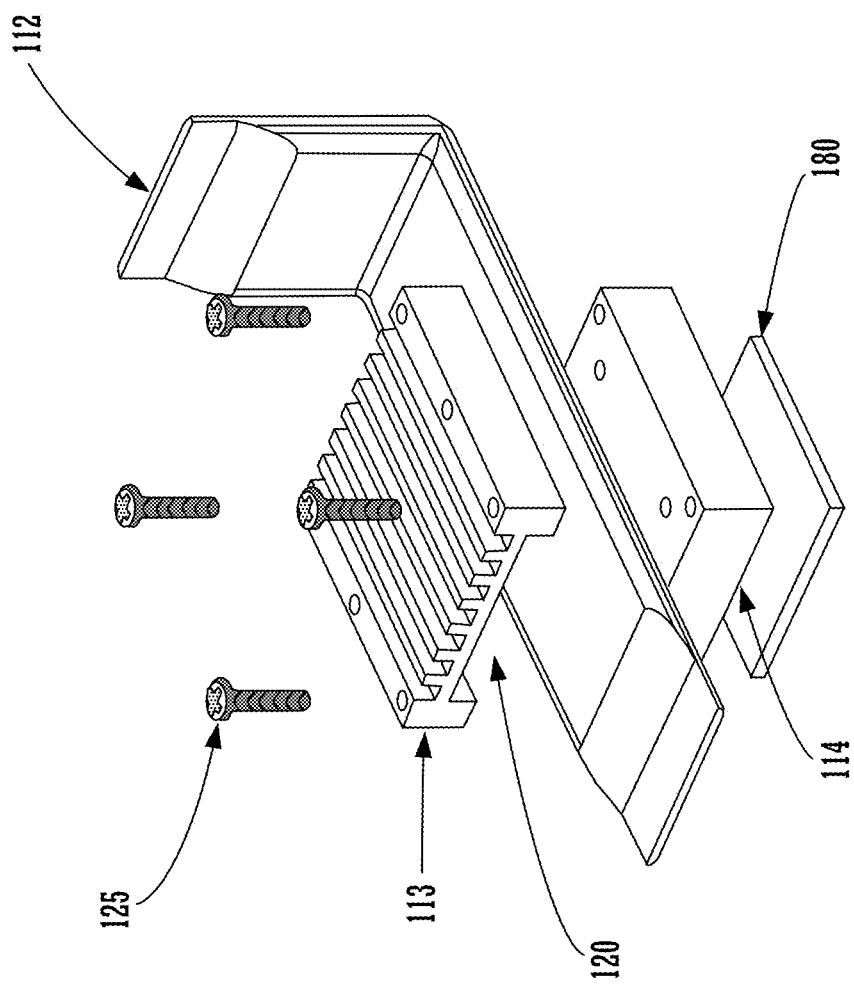
FIG. 2 is an isometric, exploded view of the heat dissipation device of FIG. 1 illustrating the heat generating source being cooled by the heat dissipation device in accordance with an embodiment of the present invention

FIG. 1 is an isometric, assembled view of a heat dissipation device in accordance with an embodiment of the present invention. By contrast, FIG. 2 is an isometric, exploded view of the heat dissipation device of FIG. 1 illustrating the heat generating source being cooled by the heat dissipation device in accordance with an embodiment of the present invention.

In one embodiment, a heat dissipation device 100 is applied for dissipating heat generated by an electronic component 180 (shown in FIG. 2) mounted on a printed circuit board (PCB) (not shown). The heat dissipation device 100 can comprise a two-piece clamping heat sink unit. The clamping unit comprises a clamp top 113 and a clamp base 114. The heat dissipation device further comprises a heat pipe 112 that is received in a slot 120 formed into one of the two pieces comprising the clamping unit. In one embodiment, slot 120 is formed into the clamp top 113 as shown in FIG. 1. In one embodiment, the two pieces of the clamping unit are held together using screws, e.g., M2 screws 125. The clamping unit can also be held together using other types of fasteners as well.

In one embodiment, the slot 120 is sized in accordance with the dimensions of the heat pipe to ensure that the heat pipe tightly fits to the clamping unit in order to achieve more efficient heat dissipation. The clamping mechanism of the heat sink unit allows effective thermal contact with the heat pipe for heat dissipation purposes.

The clamping design of the heat sink assembly also allows for easy access and serviceability of the processor or other component underlying the clamp base 114 because it allows the heat pipe 112 and the clamp units to be readily removed and detached from the PCB. Accordingly, in case of part failure, the heat pipe 112 and clamp units 113 and 114 can be readily disengaged from the PCB, the processor (or other malfunctioning part) can be replaced, and the heat pipe 112 can be re-engaged with the PCB without sacrificing any heat conductivity.

In one embodiment, the two pieces of the clamping unit can be of variable thickness depending on the heat dissipation requirements of the component that the assembly is being used to cool down. Accordingly, the heat dissipating embodiments of the present invention can be advantageously scaled in response to the amount of heat being generated by the processor (or other part). Larger sizes of both the clamping heat sink unit and the heat pipe can be employed in order to scale the heat sink assembly to service a high wattage component.

In one embodiment, the clamping unit can be machined as a single piece unit with a slot formed in between to receive the heat pipe. In this embodiment, both the clamp top and clamp base are machined as a single piece and, accordingly, screws 125 are not required to clamp the two pieces together.

In a typical embodiment, the heat pipe 112 is substantially flat. A flat heat pipe is able to tightly fit into slot 120, wherein the slot is formed in accordance with the precise dimensions of the heat pipe in order to ensure a tight fit and effective heat dissipation. Further, clamping the heat pipe 112 firmly between the clamp top 113 and base 114 ensures maximum contact and effective heat dissipation. In other less typical embodiments, however, tubular or other differently shaped heat pipes can also be employed.

In one embodiment, a thermally conductive medium, is smeared around the heat pipe 112 or slot 120 before the heat pipe is received into the slot in order to achieve a better heat dissipation. The thermally conductive medium can, for instance, be a high-density polysynthetic silver thermal compound.

In one embodiment, the heat pipe is fabricated using aluminum extrusion mechanisms and may comprise a chamber that is filled with acetone. Using aluminum in combination with acetone can allow the heat pipe to dissipate as much as 50 Watts (W) of heat in some embodiments for practical applications. In other embodiments, the heat pipe can be made of copper or similarly effective heat conducting material. Further, in other embodiments the heat pipe can be filled with a different type of liquid, e.g., water. The heat pipe advantageously allows heat to be conducted away from the processor on the PCB and the heat sink unit to a different location or device where the heat can be dissipated readily, e.g., to the enclosure (or case) for the larger device that the PCB is contained within. Accordingly, as shown in FIG. 1, while one end of the heat pipe 145 can be placed closer to the interior of the clamp, the bulk of the length of the heat pipe can be extended out to the device or location where the heat will be dissipated.

In one embodiment, the heat sink base 114 and clamp top 113 are machined using an aluminum alloy, e.g., 6061 aluminum. An advantage of using a material such as aluminum alloy 6061 is its durability.

The heat pipe can also be machined from types of heat conducting materials, e.g., alloys of copper, silver, or other effective heating conducting materials. The heat pipe is ideally constructed using a light material, which ensures that it does not exert any needless moment or force on the PCB.

As shown in FIG. 1, the clamp top 112, in one embodiment, can have additional grooves and fins. The grooves and fins increase the surface area of the clamp top surface and, accordingly, result in additional heat dissipation capability.

In one embodiment, the bottom of the base 114 of the heat sink unit can be thermally epoxied to a printed circuit board (not shown) so that the base 114 comes in direct contact with the processor or other component 180 that the heat sink assembly is being used to cool. The thermal epoxy allows the heat generated by the processor to be conducted to the base of the heat sink unit 114 and via the base 114 to the heat pipe 112. In a different embodiment, however, the base 114 can be mechanically attached to the PCB, e.g., using screws.

Figure 3:
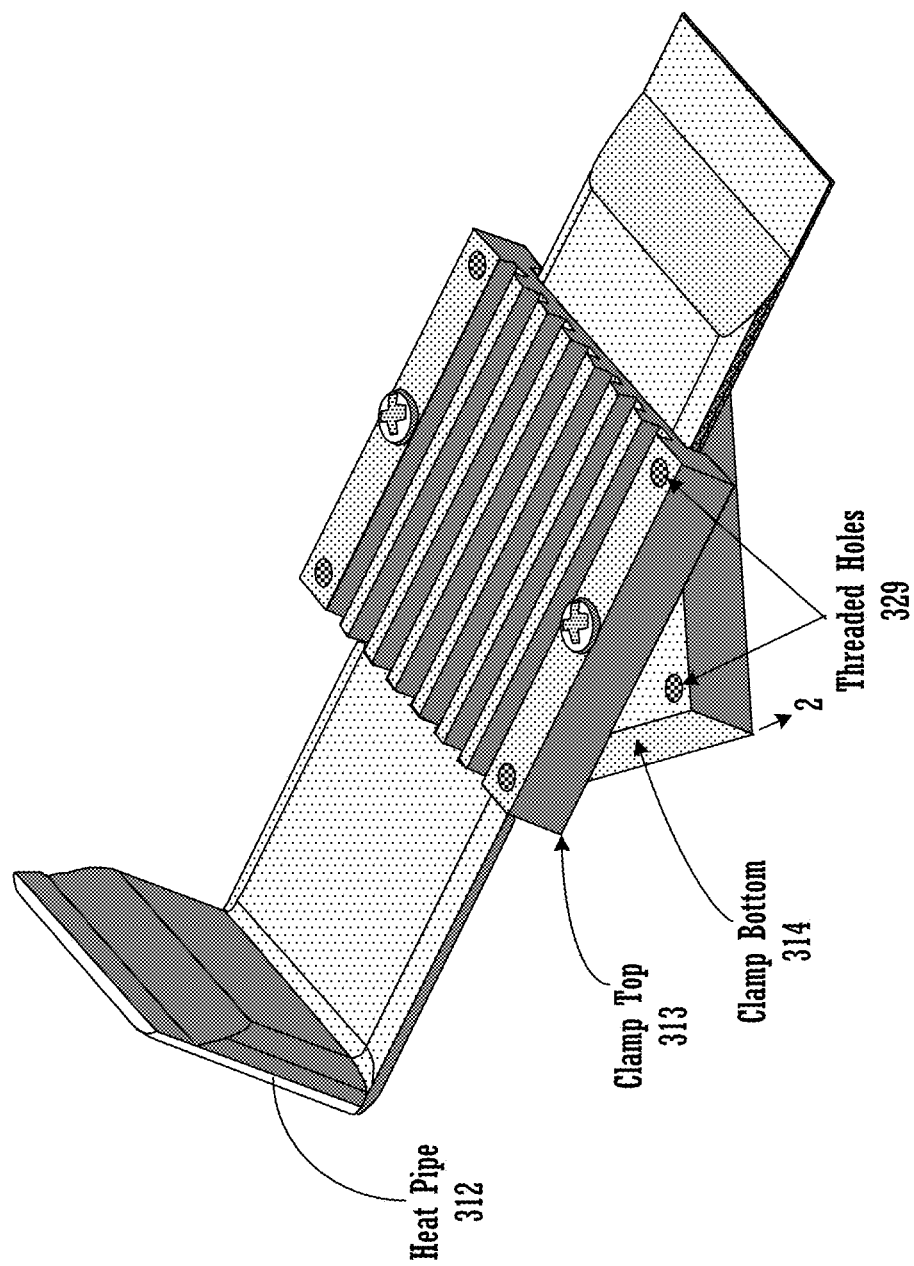
FIG. 3 is an isometric, assembled view of the heat dissipation device, wherein the top of the two-piece clamping heat sink unit is rotated to allow the heat pipe to be oriented in a different direction with respect to the base unit in accordance with an embodiment of the present invention.

FIG. 3 is an isometric, assembled view of the heat dissipation device, wherein the top of the two-piece clamping heat sink unit is rotated approximately 45 degrees, for example, to allow the heat pipe to be oriented in a different direction with respect to the base unit in accordance with an embodiment of the present invention. In one embodiment, both the clamp top 313 and base 314 have threaded holes 329 in multiple locations to allow for rotational capability in the heat sink. In the example shown in FIG. 3, the clamp top can be configured in multiple orientations separated by 45 degrees. However, in other embodiments, the clamping unit can be designed to have more granular rotational capability. The rotational capability built into the clamping heat sink unit allows the heat pipe to be advantageously positioned in one of several different directions depending on where the heat needs to be dumped or dissipated. By comparison, conventional heat pipes are rigidly affixed to the heat sink and cannot be detached or rotated for more flexibility.

Figure 4:
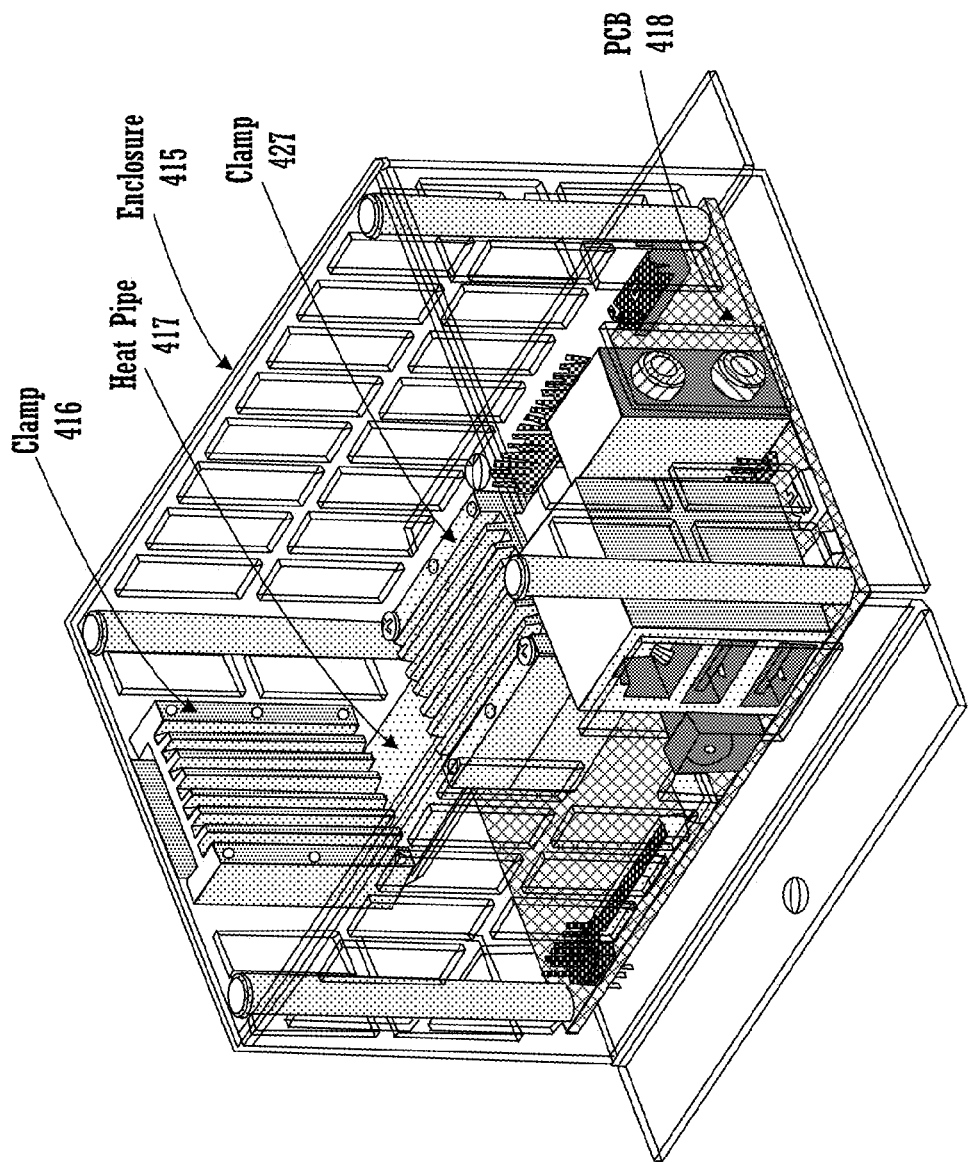
FIG. 4 illustrates the manner in which the heat dissipation device can be installed to transfer heat to an enclosure in accordance with an embodiment of the present invention.

FIG. 4 illustrates the manner in which the heat dissipation device can be installed to transfer heat to an enclosure in accordance with an embodiment of the present invention. The enclosure 415 in FIG. 4 is transparently rendered in order to easily illustrate one way in which the heat sink assembly can be situated on a PCB and used to transfer heat to the metallic casing of the enclosure. As shown in FIG. 4, one end of the heat pipe 417 is bound to heat clamp 427, wherein the heat clamp 427 may be thermally epoxied to a processor or other heat generating component (not shown) on PCB 418.

The other end of the heat pipe 417 may be bonded to the enclosure 415 using a different clamp 416. In one embodiment, clamp 416 may be similar to clamp top 113, wherein clamp 416 directly clamps heat pipe 417 to the enclosure 415 (e.g., by using self-clinching fasteners or nuts) without requiring a clamp bottom. Bonding the opposite end of heat pipe 417 to the enclosure 415 directly allows the heat to be dissipated to the enclosure 415. The enclosure 415 may in turn be placed in contact with the larger device, e.g., any suitable chassis, such as for a computer system, electronic device, game console, a jukebox, a casino game etc. it is enclosed within in order to dissipate the heat to the larger device. In one embodiment, enclosure 415 may be composed of aluminum or an aluminum alloy. Alternatively, it may also be composed of any other effective thermally conducting material.

Figure 5:
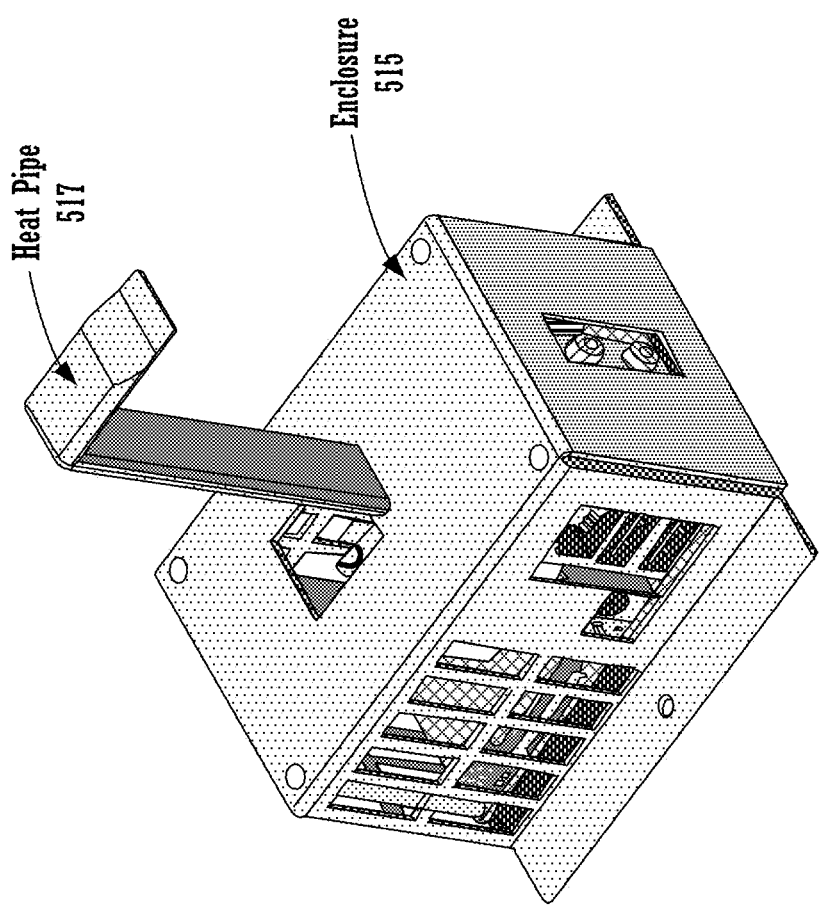
FIG. 5 illustrates the manner in which the heat pipe can be channeled through the top of the enclosure housing the board in order to transfer the heat to an external target in accordance with an embodiment of the present invention.

FIG. 5 illustrates the manner in which the heat pipe can be channeled through the top of the enclosure in order to transfer the heat to an external target in accordance with an embodiment of the present invention. In contrast to the configuration shown in FIG. 4, FIG. 5 shows that instead of clamping the heat pipe 517 to the enclosure, it can alternatively be channeled through the top of the enclosure 515 so that the heat can be dissipated to a different device or at a different location from the enclosure 515.

As also shown in FIG. 5, the heat pipe 517 can be molded in accordance with the application to include any bends. For example, the heat pipe 517 shown in FIG. 5 is bent at a 90 degree angle.

Figure 6:
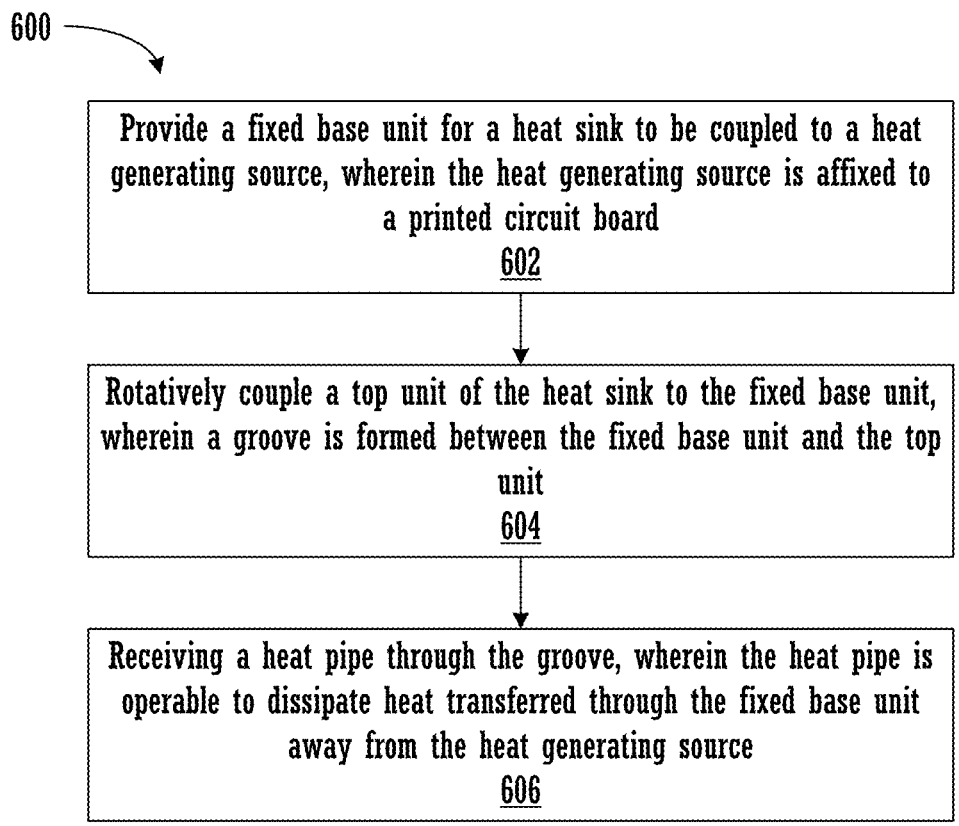
FIG. 6 depicts a flowchart of an exemplary process of assembling a heat dissipation device comprising a flat heat pipe in accordance with one embodiment of the present invention.

FIG. 6 depicts a flowchart of an exemplary process of assembling a heat dissipation device comprising a flat heat pipe in accordance with one embodiment of the present invention. The invention, however, is not limited to the description provided by flowchart 600. Rather, it will be apparent to persons skilled in the relevant art(s) from the teachings provided herein that other functional flows are within the scope and spirit of the present invention. Flowchart 900 will be described with continued reference to exemplary embodiments described above, though the method is not limited to those embodiments.

At step 602, a fixed base unit 114 for a heat sink unit is provided. The fixed base unit 114 is coupled to a heat generating source 180 which may be a processor affixed to a PCB 418.

At step 604, a top unit 113 is rotatively coupled to the base unit 114 such that a slot or groove is formed in between the top unit and the base unit. As discussed above, the slot 120 can be formed into either the top unit 113 or the base unit 114 or both. Further, the slot 120 is formed in accordance with the dimensions of the heat pipe 112.

Finally, at step 606, a heat pipe 112 is received through the groove 120, wherein the heat pipe is operable to dissipate heat transferred through the fixed base unit 114 away from the heat generating source.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware configurations. In addition, any disclosure of components contained within other components should be considered as examples because many other architectures can be implemented to achieve the same functionality.

The process parameters and sequence of steps described and/or illustrated herein are given by way of example only. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

It should also be understood, of course, that the foregoing relates to exemplary embodiments of the invention and that modifications may be made without departing from the spirit and scope of the invention as set forth in the following claims.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. A heat sink apparatus, said apparatus comprising:
   a base unit for use with an electronic component operable to make contact with a heat generating source, wherein said heat generating source is affixed to a printed circuit board;
   a top unit wherein said top unit of said heat sink is rotatively coupled to said base unit, and wherein a slot forms in between said top unit and said base unit when said top unit is coupled to said base unit; and
   a heat pipe, wherein said heat pipe is received through said slot and held tightly therein, and wherein said heat pipe is operable to dissipate heat transferred through said base unit away from said heat generating source.

2. The heat sink apparatus of claim 1, wherein said heat pipe is substantially flat in shape and wherein said top and base units form a heat sink.

3. The heat sink apparatus of claim 1, wherein said top unit clamps together with said base unit using a removable fastening mechanism, wherein said removable fastening mechanism is selected from a group consisting of: screws and self-clinching nuts.

4. The heat sink apparatus of claim 1, wherein said heat pipe comprises a chamber within that is filled with a liquid selected from a group consisting of: acetone and water.

5. The heat sink apparatus of claim 1, wherein said heat pipe is operable to transfer heat from said heat generating source to a metal enclosure, wherein said metal enclosure houses said printed circuit board.

6. The heat sink apparatus of claim 1, wherein a surface of said top unit comprises a plurality of fins and grooves, wherein said plurality of fins and grooves are operable to increase a surface area of said surface.

7. The heat sink apparatus of claim 1, wherein said heat pipe is held tightly in said slot using a thermally conducting material, wherein said thermally conducting material is operable to facilitate dissipation of heat between said heat pipe and said base and top units.

8. A method of assembling a heat dissipating device, said method comprising:
   providing a base unit of a heat sink for coupling to a heat generating source, wherein said heat generating source is affixed to a printed circuit board;
   removably coupling a top unit of said heat sink to said base unit, wherein a slot forms in between said top unit and said base unit in response to said coupling; and
   receiving a heat pipe through said slot, wherein said heat pipe is operable to dissipate heat transferred through said base unit away from said heat generating source and wherein said heat pipe is tightly held in said slot.

9. The method of claim 8, wherein said heat pipe is substantially flat in shape.

10. The method of claim 8, wherein said removably coupling comprises:
    clamping together said top unit with said base unit using a fastening mechanism, wherein said fastening mechanism is selected from a group consisting of: screws and self-clinching nuts.

11. The method of claim 8, further comprising filling said heat pipe with a liquid selected from a group consisting of: acetone and water.

12. The method of claim 8, wherein said heat pipe transfers heat from said heat generating source to a metal enclosure, wherein said metal enclosure houses said printed circuit board.

13. The method of claim 8, wherein a surface of said top unit of said heat sink comprises a plurality of fins and grooves, wherein said plurality of fins and grooves are operable to increase a surface area of said surface.

14. The method of claim 8, wherein said heat pipe is held tightly in said slot using a thermally conducting material, wherein said thermally conducting material is operable to facilitate dissipation of heat between said heat pipe and said base and top units.

15. A heat dissipating system, comprising:
    a base unit of a heat sink operable to make contact with a heat generating source, wherein said heat generating source is part of an electronic device;
    a top unit of said heat sink, wherein said top unit of said heat sink is operable to be removably coupled to said base unit in a plurality of different orientations, and wherein a slot forms in between said top unit and said base unit when said top unit is coupled to said base unit in any of said plurality of different orientations;
    a heat pipe received through said slot, and wherein said heat pipe is operable to dissipate heat transferred through said base and top units away from said heat generating source; and
    a metal enclosure, wherein said electronic device, said heat sink and said heat generating source are housed within said metal enclosure, and wherein said heat pipe further is operable to dissipate heat from said heat generating source to said metal enclosure.

16. The system of claim 15, wherein said heat pipe is substantially flat in shape.

17. The system of claim 15, wherein said heat pipe is substantially tubular in shape.

18. The system of claim 15, wherein said top unit clamps together with said base unit using a removable fastening mechanism, wherein said fastening mechanism is selected from a group consisting of: screws and self-clinching nuts.

19. The system of claim 15, wherein said heat pipe is filled with a liquid selected from a group consisting of: acetone and water.

20. The system of claim 15, wherein a surface of said top unit of said heat sink comprises a plurality of fins and grooves, wherein said plurality of fins and grooves are operable to increase a surface area of said surface.

* * * * *